May 1, 1956 W. A. SCHAPER 2,743,693

TRANSISTOR ASSEMBLY JIG

Filed Nov. 22, 1954

INVENTOR.

William A. Schaper,

BY

Mueller and Aichele Atty's.

United States Patent Office 2,743,693

Patented May 1, 1956

2,743,693

TRANSISTOR ASSEMBLY JIG

William A. Schaper, Phoenix, Ariz., assignor to Motorola, Inc., Chicago, Ill., a corporation of Illinois Application November 22, 1954, Serial No. 470,317

5 Claims. (Cl. 113—99)

The present invention relates generally to the fabrication of transistors, and more particularly to improved apparatus for expediting and simplifying the manufacture of alloyed-junction transistor units.

The alloyed-junction transistor comprises a semiconductor crystal wafer composed, for example, of germanium; the wafer having an alloying impurity material fused into each of its opposite faces to form p—n junctions within the crystal. For example, an n-type germanium wafer may be used with a p-type alloying metal impurity fused to its opposite faces. The p-type impurity is usually selected from column 3 of the periodic table, and at the present time indium is preferred. This is because indium will alloy with germanium at relatively low temperatures, and upon solidification of the indium no appreciable stresses are set up in the crystal. For reasons of clarity, the apparatus of the present invention will be described in conjunction with the fabrication of alloyed-junction transistor units comprising n-type germanium wafers and indium pellets. However, it will be apparent that the apparatus finds equal utility in the manufacture of alloyed-junction transistors using any suitable semiconductor wafers of the n- or p-type and any suitable alloying material.

The alloying of the indium to the semiconductor wafer is usually carried out in an inert atmosphere furnace (using, for example, argon) in which spheres, discs or pellets of indium are fused to the opposite faces of an n-type germanium wafer. The temperature of the furnace is raised above the melting point of the indium discs to alloy the indium with the germanium and form the p—n junctions within the crystal wafer. During the alloying process the molten indium dissolves the surface of the germanium wafer forming cavities, and this dissolution continues until the liquid indium becomes saturated with germanium at the alloying temperature. As the assembly is cooled, the germanium contained in the liquid indium is precipitated into the wafer carrying with it some of the alloying indium. This causes the formation of p-type areas within the wafer and produces p—n junctions between these areas and the n-type base region of the wafer crystal.

In accordance with a prior art practice, the germanium wafer is placed in a horizontal cavity in a graphite jig, and a graphite washer is placed in the cavity over the top of the wafer. An indium disc is then placed in the hole of the graphite washer to be held and centered by the washer on the upper face of the wafer. The assembly is then fired and later cooled. After cooling the assembly is turned upside down in the jig and the process is repeated to fuse a second indium pellet to the opposite face of the wafer.

It is essential for optimum electrical characteristics of the transistor that the fused indium discs be directly opposite one another on the germanium wafer, and it was believed that involved techniques such as the method described above were necessary to achieve such accurate positioning of the discs. However, that method is particularly cumbersome since it entails considerable manipulation of the germanium wafer, the indium pellets and the components of the jig. Moreover, it requires separate and distinct operations for firing each indium disc to the opposite faces of the germanium wafer. This not only complicates the manufacturing process, but it also causes the alloyed area of the crystal wafer that was formed during the first operation to be remelted during the second firing operation and this creates a possibility of excessive diffusion of the first junction which is undesired. In addition, it has been found that this method, in spite of its many operations, does not provide the precise positioning of the indium discs so that the resulting junctions are accurately aligned for the best electrical characteristics.

Assembly jigs have been proposed for supporting the germanium wafer and indium pellets in a manner to allow simultaneous fusing of the pellets to the opposite faces of the wafer. Such jigs greatly simplify the manufacturing process since they render it possible to overcome the disadvantages of the technique described above. The present invention is concerned with apparatus of this general type, and it specifically provides apparatus that not only enables simultaneous fusion of the indium pellets to the opposite faces of the germanium wafer to be carried out, but it also enables the simultaneous treatment of a plurality of units to be carried out in an improved manner, further to speed up the manufacturing process and render it more efficient.

It is, accordingly, an object of the present invention to provide improved apparatus for the simultaneous formation of a pair of alloyed-junctions in a semiconductor wafer, and which enables this formation to be carried out in a plurality of semiconductor wafers simultaneously to expedite the fabrication process of alloyed-junction transistor units.

A further object of the invention is to provide such improved apparatus having relatively low thermal mass for rapid heating and cooling.

Another object of the invention is to provide such improved apparatus that is inherently simple in its construction and which can be manipulated quickly and easily to fulfill its desired purpose.

Yet another object of the invention is to provide such improved apparatus that is constructed so that transistor units produced thereby have accurately aligned electrodes and junctions for improved electrical characteristics.

A further object of the invention is to provide such improved apparatus that may be readily fabricated and which is constructed to have readily replaceable components that may be refitted after wear or to adapt the apparatus for transistor units of different sizes.

A feature of the invention is the provision of improved apparatus for the simultaneous fabrication of a plurality of alloyed-junction transistors which comprises a plurality of individual assembly jigs and a holder for precisely positioning the jigs; with each jig being formed to support a semiconductor wafer and a pair of pellets of alloying material, with the pellets being accurately positioned directly opposite one another on opposite sides of the wafer to be fused and alloyed thereto.

Another feature of the invention is the provision of such improved apparatus in which each of the assembly jigs comprises a pair of notched blocks, which notches receive the pellets of alloying material, and with one of the blocks being slotted to receive the semiconductor wafer between the pellets, and the assembly being such that the blocks of each jig are held in precise alignment with one another for accurate positioning of the pellets relative to one another and to each of the wafers.

The above and other features of the invention which are believed to be new are set forth with particularity in the appended claims. The invention itself, however, together with further objects and advantages thereof may best be understood by reference to the following description when taken in conjunction with the accompanying drawing in which:

Figures 1, 2, 3, 4, 5:
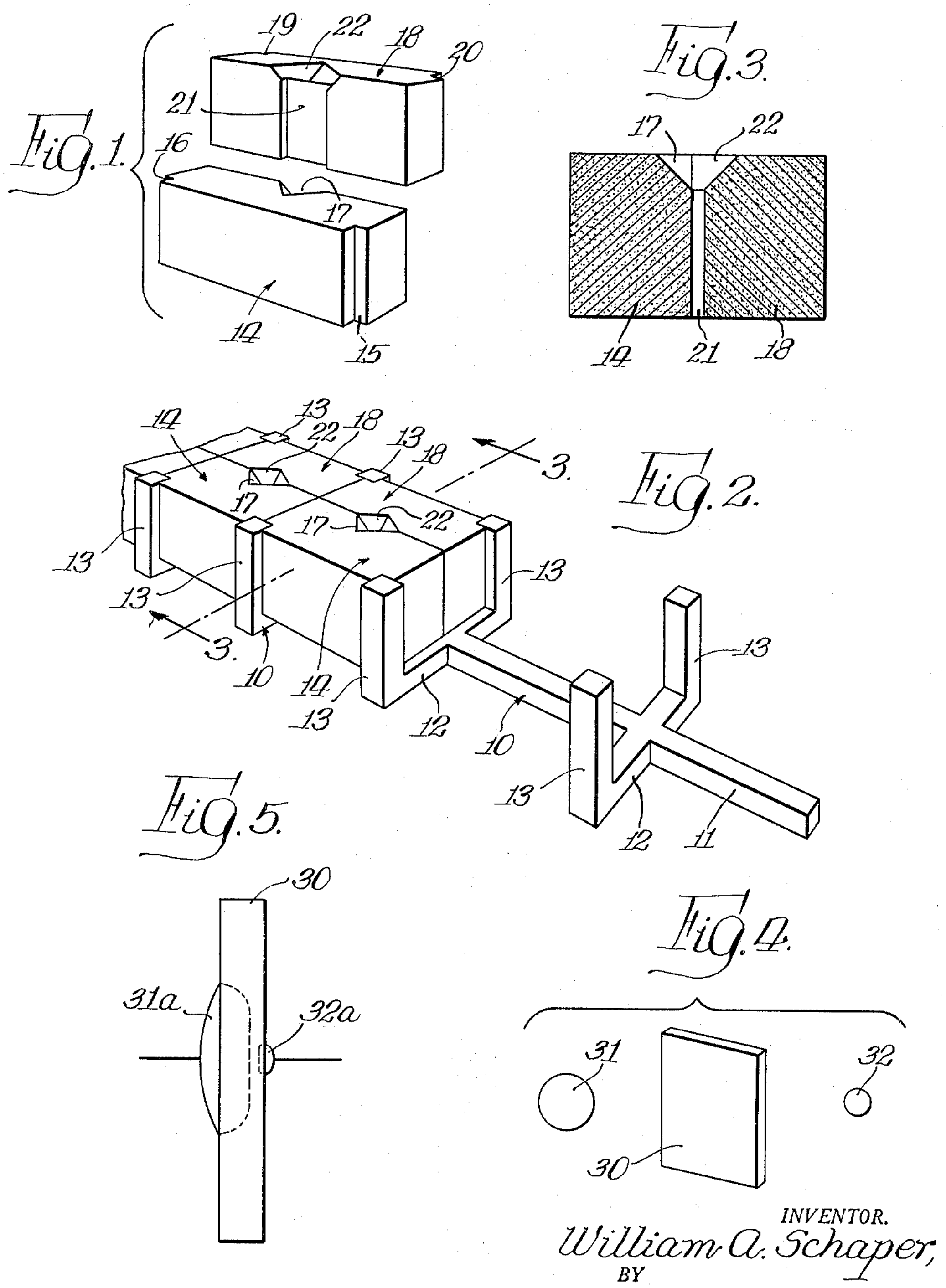
Fig. 1 shows in perspective the components of an assembly jig utilized in the apparatus of the invention.
Fig. 2 is a perspective view of the improved apparatus of the invention.
Fig. 3 is a cross-sectional view of the apparatus taken along the lines 3—3 of Fig. 2.
Fig. 4 shows various components of an alloyed-junction transistor prior to firing.
Fig. 5 shows a semiconductor wafer with electrodes of alloying material fused to the opposite faces thereof.

The apparatus of the present invention is intended to support a series of semiconductor wafers, each with a pair of pellets of alloying material disposed against opposite sides of a corresponding one of the wafers, the pellets being accurately positioned to be directly opposite one another. The apparatus comprises a holder of heat resistant material comprising a longitudinal member having a plurality of transverse brackets affixed thereto and spaced there-along with a fixed distance between each succeeding one of the brackets, and a series of assembly jigs adapted to be supported along the holder between successive ones of the brackets. Each of the assembly jigs comprises a first block of heat resistant material adapted to extend longitudinally of the holder and to be supported thereon between a pair of the brackets. The first block has a notch for receiving one of the pellets of alloying material, with the notch being formed in the edge of the block that constitutes the inner upper edge when the block is supported in the holder. A second block of heat resistant material is also provided, and the second block is adapted to extend longitudinally of the holder and to be supported thereon between the pair of brackets directly opposite the first block. The second block has a slot in the surface thereof which faces the first block when the blocks are supported in the holder, and the slot is used to receive one of the wafers and is disposed adjacent the notch in the first block. The second block also has a notch for receiving one of the pellets, and this notch is formed in an edge of the second block adjacent the slot to be directly opposite the notch in the first block when the blocks are supported in the holder.

As shown in Figs. 1–3, the improved apparatus of the present invention includes a holder 10 which is formed of stainless steel, graphite or other suitable heat resistant material. The holder comprises an elongated member 11 which extends longitudinally, and which has a plurality of integral transverse members 12 spaced equidistantly there-along, with the transverse members extending at right angles to the longitudinal member by equal distances on each side thereof. The transverse members each have a pair of integral upstanding members 13 disposed at the respective ends thereof, with the upstanding members extending at right angles to the transverse members.

The holder 10 may be fabricated by any known means out of a single block of graphite or other heat resistant material, and it is important that the transverse and upstanding members be precisely spaced along the elongated member 11. It is preferable that the transverse and upstanding members be spaced equidistantly along member 11 for interchangeability of the assembly jigs to be supported therebetween.

In a manner to be described, the transverse members 12 and upstanding members 13 form a series of brackets for positioning the components of the assembly jigs to be supported in the holder. Each of the assembly jigs comprises a first rectangular block 14 of graphite or any suitable heat resistant material, and block 14 is adapted to be fitted on one side of the elongated member 11 to be supported thereby and also to be accurately positioned and supported by two of the upstanding members. The block 14 has a pair of notches 15, 16 formed in the outer vertical edges thereof, and these notches receive the corresponding upstanding members 13 so that the block may be accurately positioned and rigidly retained on the holder. The block 14 also has a notch 17 formed in the edge thereof that constitutes the inner top edge when the block is supported in the holder.

Each of the assembly jigs also comprises a second rectangular block 18 of heat resistant material such as graphite, and this block is adapted to be fitted on the opposite side of the elongated member 10 to be supported thereby and to be positioned between and supported by corresponding upstanding members 13 directly opposite the first block. The second block has a pair of notches 19, 20 formed in the outer vertical edges thereof for receiving the upstanding members, so that this block likewise may be firmly positioned and retained by the holder.

Block 18 also has a slot 21 extending across the inner surface thereof with the slot being adjacent notch 17 when the blocks are supported in the holder. Slot 21 may be formed in block 14 instead of block 18, or in both. The second block also has a notch 22 formed in the inner upper edge thereof adjacent the slot 21 with notch 22 being positioned to be directly opposite notch 17 when the blocks are supported in the holder.

A plurality of assembly jigs, such as the jigs shown in Fig. 1, can be fabricated so as to be identical with one another. As previously noted, the holder 10 is preferably constructed so that the brackets formed by the transverse members 12 and upstanding members 13 are spaced equidistantly along the elongated member 10. Then, by inserting the various components of the jig assembly between the brackets of the holder in the manner illustrated and described, each of the assembly jigs is supported to have its notches directly opposite one another.

As shown in Fig. 4, a semiconductor wafer 30 which, for example, may be composed of n-type germanium, is inserted in each of the slots 21 to be supported vertically and sandwiched between the blocks 14 and 18 in each of the assembly jigs. A pair of spheres of alloying material 31, 32 which, for example, may be composed of indium, are placed respectively in the notches 22 and 17. Therefore, each assembly jig supports a crystal wafer 30, with a pair of pellets, spheres or discs of alloying material precisely positioned on opposite faces 10. It is usually desired that the electrodes formed on the semiconductor crystal be disposed centrally of the crystal, and for that reason, it is preferred that the notches and slots in the assembly jigs be so located as to provide such central positioning.

After the wafers and pellets are loaded on all the assembly jigs, the apparatus is then placed in a heating zone. As previously noted, this heating zone may be a suitable furnace having an inert atmosphere, such as argon. The heating of the pellets above the melting point produces the alloying action described previously herein, and results in the formation of the assembly shown in Fig. 5. This assembly comprises the semiconductor wafer 30 having a fused electrode **31*a* and a fused electrode 32*a***, with the electrodes each having recrystallized areas adjacent thereto within the crystal, and which areas form p—n junctions (shown by the dotted lines) with the crystal material in the base region of the wafer.

It is an extremely simple matter to load the apparatus of the invention, since it entails merely the insertion of wafers in the respective slots, and spheres or pellets of the alloying material in the corresponding notches. After the apparatus has traveled through the heat zone, it is also a simple matter to withdraw the various fused assemblies.

The use of the separate assembly jigs of the configuration described herein and of a holder for supporting the jigs in accurate predetermined positions, provides a construction whereby the notches and slots of each of the assembly jigs are precisely positioned with respect to one another so as to provide for precise positioning of the corresponding fused electrodes of the assemblies fabricated by the invention.

The individual blocks of the apparatus are removable so that they can be easily replaced when they become worn, or to adapt the apparatus to accommodate different transistor sizes. Moreover, the apparatus is constructed to have a relatively low thermal mass for rapid heating and cooling.

I claim:

1. Apparatus for supporting a plurality of semiconductor wafers, and for further supporting a pair of pellets of alloying material adjacent each of the wafers with the pellets of each such pair being disposed directly opposite one another adjacent the opposite sides of the corresponding wafer to be simultaneously fused thereto, said apparatus including a holder of heat resistant material comprising a longitudinal member having a plurality of transverse brackets affixed thereto and spaced therealong with a fixed distance between each succeeding one of said brackets; and a series of assembly jigs adapted to be supported along said holder between successive ones of said brackets, each of said assembly jigs comprising, a first block of heat resistant material adapted to extend longitudinally of said holder and to be supported thereon between a pair of said brackets, said first block having a notch for receiving one of the pellets formed in the edge thereof that constitutes the inner upper edge when said first block is supported in said holder, a second block of heat resistant material adapted to extend longitudinally of said holder and to be supported thereon between said pair of brackets opposite to said first block, said second block having a slot in a surface thereof for receiving one of the wafers and to be adjacent said notch in said first block when said blocks are supported in said holder, and said second block having a notch for receiving one of the pellets formed in an edge thereof adjacent said slot to be opposite said notch in said first block when said blocks are supported in said holder.

2. Apparatus for supporting a plurality of semiconductor wafers, and for further supporting a pair of pellets of alloying material adjacent each of the wafers, with the pellets of each such pair being disposed directly opposite one another adjacent the opposite sides of the corresponding wafer to be simultaneously fused thereto, said apparatus including a holder of heat resistant material comprising a longitudinal elongated member having a plurality of transverse integral brackets extending at right angles thereto and spaced equidistantly therealong; and a series of assembly jigs adapted to be supported along said holder between successive ones of said brackets, each of said assembly jigs comprising, a first rectangular block of heat resistant material adapted to extend longitudinally of said holder and to be supported on said longitudinal member between a pair of said brackets, said first block having a notch for receiving one of the pellets formed in the edge thereof that constitutes the inner upper edge when said first block is supported in said holder, a second rectangular block of heat resistant material adapted to extend longitudinally of said holder and to be supported on said longitudinal member between said pair of brackets directly opposite said first block, said second block having a slot in a surface thereof for receiving one of the wafers and to be adjacent said notch in said first block when said blocks are supported in said holder, and said second block having a notch for receiving one of the pellets formed in an edge thereof adjacent said slot to be directly opposite said notch in said first block when said blocks are supported in said holder.

3. Apparatus for supporting a plurality of semiconductor wafers, and for further supporting a pair of pellets of alloying material adjacent each of the wafers, with the pellets of each such pair being disposed directly opposite one another adjacent the opposite sides of the corresponding wafer to be simultaneously fused thereto, said apparatus including a holder of heat resistant material comprising an elongated member, a plurality of transverse members spaced along said elongated member and extending on both sides of said elongated member, and a pair of upstanding members at the respective ends of each of said transverse members; and a series of assembly jigs adapted to be supported along said holder between said upstanding members, each of said assembly jigs comprising, a first block of heat resistant material adapted to be fitted on one side of said elongated member to be supported thereby and to be positioned between and supported by two of said upstanding members, said first block having a notch for receiving one of the pellets formed in an edge thereof constituting the inner upper edge when said first block is supported in said holder, a second block of heat resistant material adapted to be fitted on the opposite side of said elongated member to be supported thereby and to be positioned between and supported by two of said upstanding members to be directly opposite said first block, said second block having a slot in a surface thereof for receiving one of the wafers and to be adjacent said notch in said first block when said blocks are supported in said holder, and said second block having a notch for receiving one of the pellets formed in an edge thereof adjacent said slot to be directly opposite said notch in said first block when said blocks are supported in said holder.

4. Apparatus for supporting a plurality of semiconductor wafers, and for further supporting a pair of pellets of alloying material adjacent each of the wafers, with the pellets of each such pair being disposed directly opposite one another adjacent the opposite sides of the corresponding wafer to be simultaneously fused thereto, said apparatus including a holder of heat resistant material comprising an elongated member, a plurality of integral transverse members spaced equidistantly along said elongated member and extending at right angles thereto on both sides of said elongated member, and a pair of integral upstanding members at the respective ends of each of said transverse members and extending at right angles thereto; and a series of assembly jigs adapted to be supported along said holder between said upstanding members, each of said jigs comprising, a first rectangular block of heat resistant material adapted to be fitted on one side of said elongated member to be supported thereby and to be positioned between and supported by two of said upstanding members, said first block having a pair of notches formed in respective edges thereof for receiving the upstanding members, said first block further having a notch for receiving one of the pellets formed in an edge thereof constituting the inner top edge when said block is supported in said holder, a second rectangular block of heat resistant material adapted to be fitted on the opposite side of said elongated member to be supported thereby and to be positioned between and supported by two of said upstanding members to be directly opposite said first block, said second block having a pair of notches formed in respective edges thereof for receiving the upstanding members, said second block further having a slot extending across a surface thereof for receiving one of wafers and to be adjacent said notch in said first block when said blocks are supported in said holder, and said second block further having a notch for receiving one of the pellets formed in an edge thereof adjacent said slot to be directly opposite said notch in said first block when said blocks are supported in said holder.

5. Apparatus for supporting a plurality of semiconductor wafers, and for further supporting a pair of pellets of alloying material adjacent each of the wafers with the pellets of each such pair being disposed directly opposite one another adjacent the opposite sides of the corresponding wafer to be simultaneously fused thereto, said apparatus including a holder of heat resistant material comprising a longitudinal member having a plurality of transverse brackets affixed thereto and spaced therealong with a fixed distance between each succeeding one of said brackets; and a series of assembly jigs adapted to be supported along said holder between successive ones of said brackets, each of said assembly jigs comprising, a first block of heat resistant material adapted to extend longitudinally of said holder and to be supported thereon between a pair of said brackets, said first block having a notch for receiving one of the pellets formed in an edge thereof that constitutes the inner upper edge when said first block is supported in said holder, a second block of heat resistant material adapted to extend longitudinally of said holder and to be supported thereon between a pair of said brackets opposite said first block, said second block having a notch for receiving one of the pellets formed in an edge thereof to be opposite said notch in said first block when said blocks are supported in said holder, and at least one of said blocks having a slot in the surface thereof to receive one of the wafers and to position such wafer between said notches.

No references cited.